United States Patent [19]
Kurth

[11] 3,944,951
[45] Mar. 16, 1976

[54] MONOLITHIC CRYSTAL FILTER

[75] Inventor: Carl Ferdinand Kurth, Andover, Mass.

[73] Assignee: Bell Telephone Laboratories, Incorporated, Murray Hill, N.J.

[22] Filed: Nov. 21, 1974

[21] Appl. No.: 525,885

[52] U.S. Cl. .................... 333/72; 310/8.2; 310/9.8; 333/70 R
[51] Int. Cl.².... H03H 9/20; H03H 9/26; H03H 9/32
[58] Field of Search .......... 333/72, 71, 70 R; 310/8, 310/8.1, 8.2, 8.3, 9, 9.5, 9.7, 9.8

[56] References Cited
UNITED STATES PATENTS

| | | | |
|---|---|---|---|
| 2,233,199 | 2/1941 | Donley | 333/72 |
| 2,373,431 | 4/1945 | Sykes | 333/772 |
| 2,429,639 | 10/1947 | McSkimin | 333/72 |
| 3,334,307 | 8/1967 | Blum | 333/72 X |
| 3,564,463 | 2/1971 | Beaver et al. | 333/72 |
| 3,656,180 | 4/1972 | Braun | 333/71 |
| 3,739,304 | 6/1973 | Braun | 333/72 |
| 3,831,116 | 8/1974 | Davis, Jr. et al. | 333/72 |
| 3,836,877 | 9/1974 | Guntersdorfer | 333/72 |

*Primary Examiner*—Alfred E. Smith
*Assistant Examiner*—Marvin Nussbaum
*Attorney, Agent, or Firm*—John J. Torrente; Wilford L. Wisner

[57] ABSTRACT

An improved monolithic crystal filter is disclosed. The filter has input and output ports formed from particular combinations of first, second and third terminals, the latter terminals having been adapted to be connected to certain preselected electrodes of the two adjacent resonators comprising the filter. More specifically, the first terminal is adapted to be connected to one of the electrodes of a first one of the aforesaid two resonators, the second terminal to the other electrode of the first resonator and to one of the electrodes of the second of the two resonators, and the third terminal to the remaining electrode of the second resonator. With the first, second and third terminals so adapted, the employment of the first and third terminals as one of the input and output ports of the filter and the employment of any other combination of two of the terminals as the other one of the input and output ports thereof results in a filter which is found to exhibit two finite frequency attenuation poles whose locations can be varied by varying the filter parameters. As a result, by proper selection of such filter parameters, the attenuation poles of the filter can be made to bracket the filter passband, thereby causing the filter attenuation characteristic to steeply rise near the edges of such band.

3 Claims, 9 Drawing Figures

MONOLITHIC CRYSTAL FILTER

BACKGROUND OF THE INVENTION

This invention relates to monolithic crystal filter structures and more particularly to monolithic crystal filter structures exhibiting attenuation peaks at the edges of the filter passband.

The term "monolithic crystal filter" is used herein to define the basic filter structure disclosed in U.S. Pat. No. 3,564,463, issued on Feb. 16, 1971 to W. B. Beaver and R. A. Sykes. As disclosed in the aforesaid patent, such a monolithic crystal filter comprises a plurality of resonators which share a common piezoelectric wafer. More particularly, a monolithic crystal filter is characterized by two distinguishing features, namely, mass loading and acoustic coupling. The term mass loading refers to a particular electrode mass which is determined by the nature of the piezoelectric body and its thickness, and by the size and density of the electrodes which make up each of the resonators. Acoustic coupling, on the other hand, refers to the existence of an energy channel in the piezoelectric body which effects the transmission of acoustic energy between the input and output electrodes. By virtue of a specific combination of mass loading and acoustic coupling, the image impedance of the monolithic crystal filter structure as a whole conforms to a specifically defined pattern. Additionally, the structure, as a whole, has an equivalent circuit in the form of a lattice network with resonant and antiresonant frequencies characterized by a specifically defined relation.

In order to ensure the sharpest possible cutoff action and corresponding high degree of selectivity, the attenuation characteristic of any effective band filter, including a monolithic crystal filter, should be marked by steep skirts of attenuation near the filter passband. In the case of a monolithic crystal filter, one particular technique for achieving such steep attenuation skirts has been to modify the conventional monolithic filter structure such that the structure is made to exhibit attenuation poles close to the filter passband. Unfortunately, however, the modifications used to date in realizing such attenuation poles have involved the adding of other signal paths and/or resonators to the basic filter structure, thereby tending to increase its complexity.

It is therefore a broad object of the present invention to improve the attenuation characteristics of a conventional monolithic crystal filter by establishing controllable attenuation poles relatively close to the filter passband in a manner which does not overly increase the complexity of the filter structure.

SUMMARY OF THE INVENTION

In accordance with the principles of the present invention, the above and other objectives are realized by modifying an otherwise conventional monolithic crystal filter so as to employ as the input and output ports thereof particular combinations of first, second and third terminals, the latter terminals having been adapted to be connected to certain preselected electrodes of the two adjacent resonators comprising the filter. More specifically, the first terminal is adapted to be connected to one of the electrodes of a first one of the aforesaid two resonators, the second terminal to the other electrode of the first resonator and to one of the electrodes of the second of the two resonators, and the third terminal to the remaining electrode of the second resonator. With the first, second and third terminals so adapted, the employment of the first and third terminals as one of the input and output ports of the filter and the employment of any other combination of two of the terminals as the other one of the input and output ports thereof results in a filter which is found to exhibit two finite frequency attenuation poles whose locations can be varied by varying the filter parameters. As a result, by proper selection of such filter parameters, the attenuation poles of the filter can be made to bracket the filter passband, thereby providing the required steep rise in the filter characteristic near the band.

While it can be appreciated that the present invention can take on a number of embodiments, in one particular embodiment to be described herein, the input port of the filter comprises the first and third filter terminals and the output port comprises the third and second filter terminals. In another embodiment, the output port of the filter comprises the first and third terminals and the input port the third and second filter terminals.

In a further embodiment of the invention, a plurality of filters modified in accordance with the principles of the present invention are cascaded to result in a composite bandpass filter.

DESCRIPTION OF THE DRAWINGS

A clearer understanding of the above-mentioned features of the present invention can be obtained by reference to the following detailed description taken in conjunction with the following drawings, in which.

DETAILED DESCRIPTION

Figure 1:
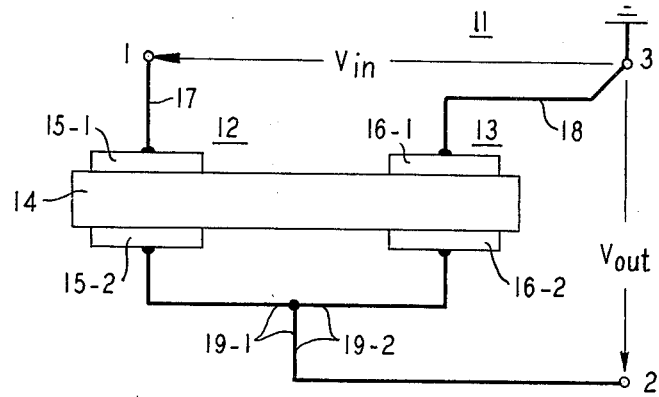
FIG. 1 illustrates a monolithic crystal filter in accordance with the principles of the present invention.

In FIG. 1, a monolithic crystal filter (MCF) 11 in accordance with the principles of the present invention is shown. With the exception of certain modifications to be explained hereinbelow regarding the input and output ports of filter 11, the filter is formed in accordance with the monolithic crystal fibers taught in the above-mentioned Beaver-Sykes patent.

More specifically, as shown, MCF 11 comprises first and second acoustically coupled resonators 12 and 13 which are formed by sandwiching portions of a piezoelectric wafer or body 14 between electrode pairs 15-1, 15-2 and 16-1, 16-2, respectively. Additionally, filter 11 is provided with three terminals 1, 2 and 3 which provide means for applying a signal $V_{in}$ to the filter and extracting a signal $V_{out}$ from the filter. The latter terminals, in turn, are adapted to be connected to particular ones of the elctrodes of electrode pairs 15 and 16. As shown in FIG. 1, terminals 1 and 3 are adapted, via respective circuits 17 and 18, to be connected to electrodes 15-1 and 16-1, respectively, and terminal 2 is adapted, via circuits 19-1 and 19-2, to be connected to electrodes 15-2 and 16-2. It should be noted, however, that the principles of the invention apply as well when terminals 1 and 3 are adapted to be connected to electrodes 15-1 and 16-2, respectively, and terminal 2 is adapted to be connected to electrodes 15-2 and 16-1. It should be also noted, moreover, that while each of the circuits 17, 18, 19-1 and 19-2 is shown in FIG. 1 as being comprised of a conductive element, each of the circuits might also be comprised of a reactive element or of a combination of reactive and conductive elements.

As can be appreciated, if filter 11 was entirely conventional and not modified in the manner to be discussed hereinbelow, the input port of the filter would typically comprise the terminals 1 and 2 and the output port the terminals 2 and 3. As is known, however, with the aforesaid terminals defining the input and output ports of the filter, the filter exhibits poles of attenuation only at zero or infinite frequency. This, in turn, results in the attenuation characteristic of the filter having attenuation skirts which rise monotonically and, hence, attenuation skirts which do not provide a precise enough demarcation of the filter passband for some filter applications.

In accordance with the principles of the present invention, the input and output ports of MCF 11 are formed so that the filter exhibits skirts of attenuation which rise at a significantly faster rate than in the above-mentioned conventional situation. In particular, in accordance with the invention, one of the aforesaid input and output ports of MCF 11 is formed from the terminals 1 and 3, while the other of the aforesaid input and output ports is formed from any other combination of two of the terminals. With the input and output ports of the filter so formed, the filter is found to exhibit two poles of attenuation which are at finite frequencies and which are controllable by variation of the filter parameters. As a result, by proper selection of the aforesaid parameters, one attenuation pole can be situated on one side of the filter passband and the other on the other side of the passband. With the poles so situated, the filter attenuation characteristic exhibits peaks of attenuation on both sides of the band, thereby resulting the above-mentioned steep rise in the attenuation skirts.

In the illustrative embodiment of FIG. 1, the input port of MCF 11 is formed by terminals 1 and 3, the latter terminal being shown for illustrative purposes as being grounded. Thus, the input signal $V_{in}$ is applied to the filter across the aforesaid two terminals. The output port of the filter, on the other hand, is formed from terminals 2 and 3 and, as a result, the output signal $V_{out}$ is extracted from across the latter two terminals.

Figure 2:
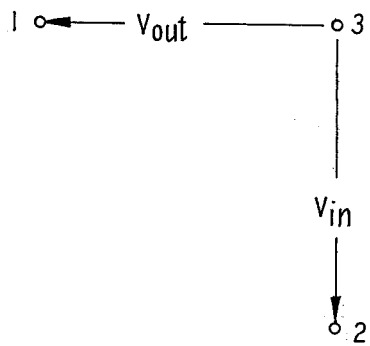
FIGS. 2 and 3 show two other input and output port combinations for the filter of FIG. 1.
Figure 3:
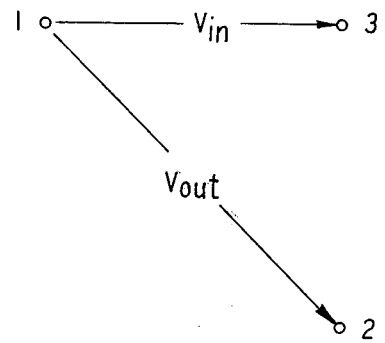

It should be noted that other combinations of the terminals 1, 2 and 3 could also be used to form the input and output ports of the filter. Two such other combinations of the terminals are pictured in FIGS. 2 and 3. In particular, in FIG. 2, the output ports of the filter is formed from terminals 1 and 3 and the input port from terminals 2 and 3. In FIG. 3, on the other hand, the input port is formed from terminals 1 and 3, the output port from terminals 1 and 2.

Figure 4:
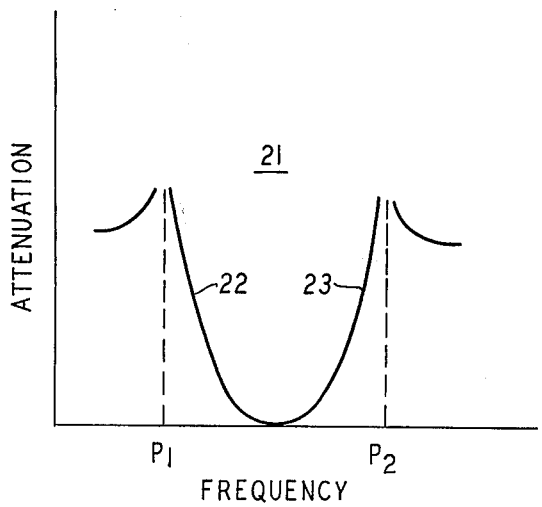
FIG. 4 illustrates a typical attenuation characteristic to be expected from the filter of FIG. 1.

In FIG. 4, a typical attenuation characteristic 21 realizable with the MCF 11 of FIG. 1 is illustrated. As can be seen, the characteristic exhibits peaks of attenuation at the frequencies $P_1$ and $P_2$ which, as a result of appropriate selection of the filter parameters, have been made to bracket the filter passband. These peaks of attenuation, as can also be observed, result in steeply rising attenuation skirts 22 and 23 which provide a clear demarcation of the filter passband.

Figure 5:
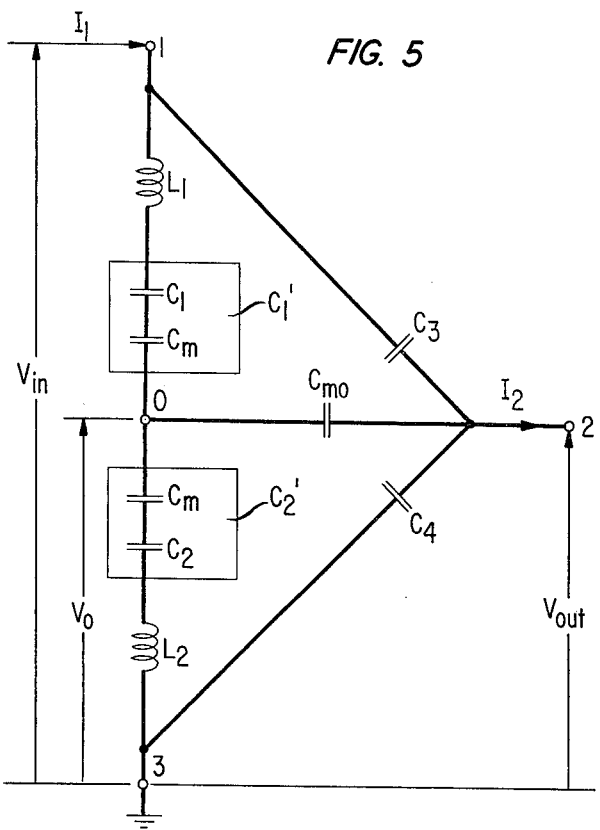
FIG. 5 illustrates the equivalent circuit of the filter of FIG. 1.

In order to illustrate more clearly that the MCF filter 11 does, in fact, have attenuation poles which result in the attenuation peaks shown in FIG. 4, the filter will now be analyzed employing the equivalent circuit of the filter shown in FIG. 5. More particularly, in FIG. 5, the inductive and capacitive components $L_1$ and $C_1$ and $L_2$ and $C_2$ correspond, respectively, to the electrical equivalents of the motional parameters of the resonators 12 and 13 of filter 11. The three capacitive elements $C_m$, $C_m$ and $C_{mo}$, on the other hand, correspond to the electrical equivalent of the acoustic coupling between such resonators. Additionally, the respective capacitances $C_3$ and $C_4$ represent the electrical equivalents of the interelectrode capacitances between the pairs of resonator electrodes 15 and 16. As indicated in the figure, the series capacitances $C_1$ and $C_m$ have been combined to form a single equivalent capacitance $C'_1$ and the series capacitances $C_2$ and $C_m$ have been combined to form a single equivalent capacitance $C'_2$.

With node 3 taken as reference, the matrix description for the four node equivalent circuit of FIG. 5 is given by:

$$\begin{bmatrix} I_1 \\ 0 \\ I_2 \end{bmatrix} = \begin{bmatrix} Y_{11} & -Y_{10} & -Y_{12} \\ -Y_{01} & Y_{00} & -Y_{02} \\ -Y_{21} & -Y_{20} & Y_{22} \end{bmatrix} \begin{bmatrix} V_{in} \\ V_o \\ V_{out} \end{bmatrix} \quad (1)$$

where, using S as a complex frequency, the admittances of the matrix are as follows:

$$Y_{11} = \frac{S}{L_1(S^2+1/L_1C_1')} + SC_3, \quad (2)$$

$$Y_{00} = \frac{S}{L_1(S^2+1/L_1C_1')} + \frac{S}{L_2(S^2+1/L_2C_2')} + SC_{mo}, \quad (3)$$

$$Y_{22} = S(C_{mo} + C_3 + C_4), \quad (4)$$

$$Y_{12} = Y_{21} = SC_3, \quad (5)$$

$$Y_{10} = Y_{01} = \frac{S}{L_1(S^2+1/L_1C_1')}, \quad (6)$$

and $$Y_{02} = Y_{20} = SC_{mo}. \quad (7)$$

Using Equations 1–7 and standard network analysis techniques (see, for example, W. Cauver, *Synthesis of Linear Communication Networks*, Vol. I. McGraw-Hill Book Company Inc., N.Y., 1958), the ratio of $V_{in}$ to $V_{out}$ can be shown to be of the form $$\frac{V_{in}}{V_{out}} = \frac{S^6A_6+S^5A_5+S^4A_4+S^3A_3+S^2A_2+SA_1+A_0}{S(S^2+P_1^2)(S^2+P_2^2)} \quad (8)$$

Equation 8 hereinabove is the general expression for the attenuation function $V_{in}/V_{out}$ of the equivalent circuit of FIG. 5. As is apparent for such equation, the attenuation function of the circuit is infinite at finite values of S, and not only at values of S equal to 0 or infinity as is the case in a conventional MCF. This means that the filter 11 has attenuation poles at such finite frequencies, i.e., at the finite frequencies $P_1$ and $P_2$.

In the particular situation in which the parameters $L_1$ and $L_2$ of the equivalent circuit of FIG. 5 are equal and, in addition, the parameters $C_1'$ and $C_2'$ of the circuit are also equal, the expressions for the frequencies $P_1$ and $P_2$ can be shown to be as follows $$P_1 = \sqrt{29 \frac{1}{L_1 C_1'}}, \quad (9)$$

$$P_2 = \sqrt{\frac{2C_1+C_{mo}}{L_1 C_{mo} C_1'} + \frac{1}{L_1 C_3}}. \quad (10)$$

It can be appreciated from equations 9 and 10 that for the above-mentioned situation (i.e., $L_1 = L_2$ and $C_1' = C_2'$), proper selection of the parameters $L_1$, $C_{mo}$, $C_1'$, and $C_3$ of filter 11 will locate the frequency $P_1$ below and the frequency $P_2$ above the filter passband, thereby resulting in an attenuation characteristic for the filter as shown in FIG. 4.

As was indicated hereinabove, the principles of the present invention apply as well to the situation in which the terminals 1 and 3 are adapted to be connected to electrodes 15-1 and 16-2, respectively, and the terminal 2 is adapted to be connected to electrodes to 15-2 and 16-1. It should be noted that under such circumstances the equivalent circuit for the filter would be the same as shown in FIG. 5, and the attenuation function and finite attenuation poles of the filter would be the same as given in equations 8–10, with the exception that the capacitance $C_{mo}$ in such circuit and in such equations would be replaced by a capacitance $-C_{mo}$.

In the discussion hereinabove of FIGS. 2 and 3, it was indicated that the present invention is capable of taking on a number of embodiments which can be realized by employing various combinations of the terminals 1, 2 and 3 for the input and output ports of the filter 11. This fact is substantiated by the symmetrical nature of the circuit of FIG. 5. Thus, for example, from the symmetry of the circuit, it is apparent that similar attenuation functions would be realized with terminals 1 and 3 as the input port of the circuit and either terminals 2 and 3 or terminals 2 and 1 as the output port thereof.

Figure 6:
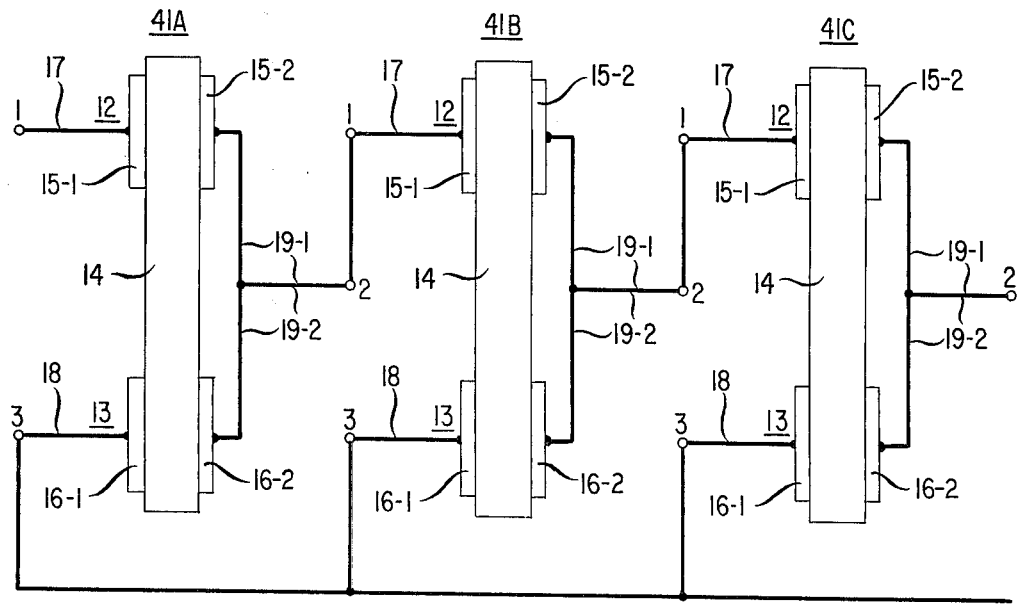
FIG. 6 shows a plurality of filters of the type illustrated in FIG. 1 connected in cascade.

As can be readily appreciated, the MCF 11 of FIG. 1 can be used to form more complex bandpass filters having two or more finite attenuation poles bracketing their respective passbands. In FIG. 6 a complex bandpass filter 41 is illustrated in which the filter is formed by cascading a plurality of MCF's which are similar to MCF 11 of FIG. 1.

More particularly, filter 41 comprises 3 MCF's 41A, 41B and 41C, each of which is, as above-indicated, similar to MCF 11. As can be seen, the elements comprising the aforesaid filters 41A, 41B and 41C have been labelled in a like manner as those comprising MCF 11. Thus, as shown, each filter comprises two resonators 12 and 13, the former of which being formed by sandwiching a portion of a piezoelectric wafer 14 between electrodes 15-1 and 15-2 and latter of which being formed by sandwiching a portion of wafer 14 between electrodes 16-1 and 16-2.

Additionally, each of the filters 41A, 41B, and 41C, also comprises three terminals 1, 2, 3. The three terminals comprising each filter, in turn, are selectively employed as the input and output ports of their respective filter. Thus, as shown, the terminals 1 and 3 of a particular filter form the input port thereof, while the terminals 2 and 3 of a particular filter form the output port thereof. Moreover, the three terminals comprising each of the filters 41A, 41B, and 41C are adapted to be connected to certain ones of the electrodes included in their respective filter. In particular, terminal 1 of a particular filter is adapted to be connected, via its respective conductive path 17, to electrode 15-1 of the filter, terminal 2 of a particular filter is adapted to be connected, via its respective paths 19-1 and 19-2, to electrodes 15-2 and 16-2 of the filter and terminal 3 of a particular filter is adapted to be connected, via its respective path 18, to electrode 16-1 of the filter.

As can be seen, interconnection of the filters 41A, 41B and 41C to form the composite filter 41 is accomplished by connecting the output port of the first filter 41A to the input port of the intermediate filter 41B and by further connecting the output of the latter filter to the input port of the last filter 41C. More particularly, as shown, terminals 2 and 3 of filter 41A are connected to terminals 1 and 3, respectively, of filter 41B and terminals 2 and 3 of filter 41B are connected to terminals 1 and 3, respectively, of filter 41C.

Figure 7:
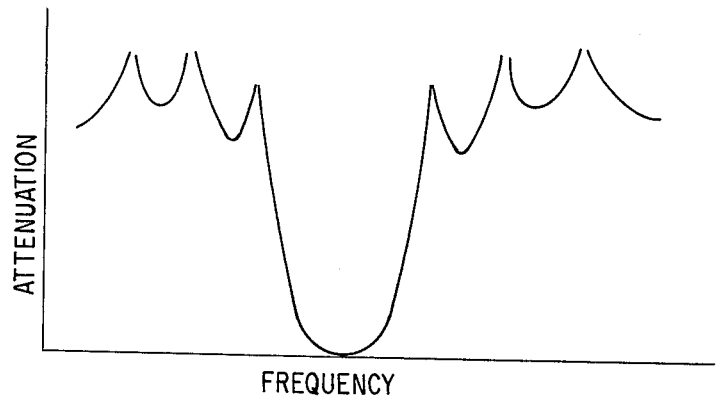
FIG. 7 depicts a typical attenuation characteristic for the arrangement of FIG. 6.

In FIG. 7, a typical attenuation characteristic realizeable for the filter of FIG. 6 is illustrated. As can be observed therefrom, the filter 41 exhibits three attenuation peaks at one end of the band and three at the other end of the band. These peaks of attenuation cause the characteristic to rise sharply at the band edges, thereby providing increased demarcation of the filter passband over that realizable employing the single MCF 11 of FIG. 1.

Figure 8:
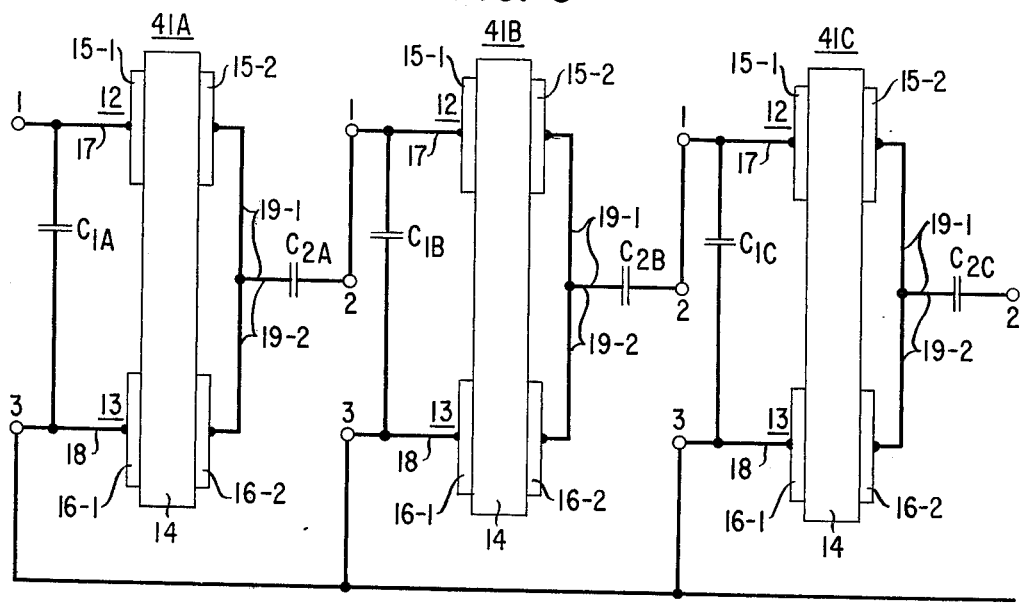
FIG. 8 shows a modification of the arrangement of FIG. 6 in which tuning capacitors are employed.

FIG. 8 shows a further modification of the filter of FIG. 6 in which tuning of the filter is provided by tuning capacitors $C_{1A}$, $C_{1B}$, and $C_{1C}$ which are connected across the terminals 1 and 3 of filters 41A, 41B and 41C, respectively, and by tuning capacitors $C_{2A}$, $C_{2B}$, and $C_{2C}$ which are connected in series with the terminals 2, respectively, of such filters.

Figure 9:
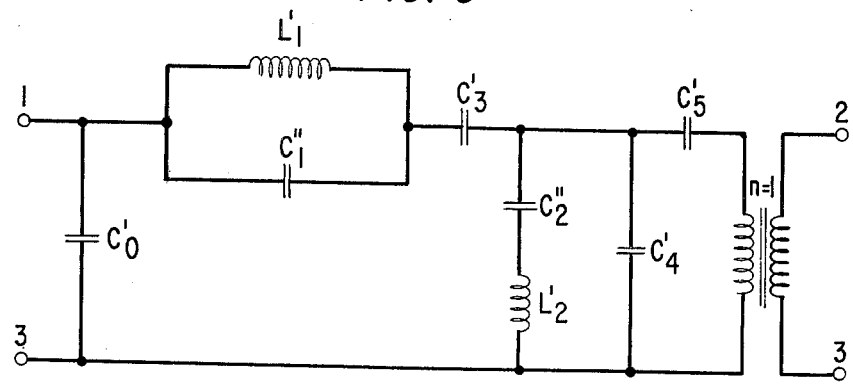
FIG. 9 shows a ladder-type equivalent circuit of the filter of FIG. 1.

It should be pointed out that the design of filter 11 of FIG. 1 to meet specific requirements can be carried out in a conventional manner using the equivalent circuit of the filter shown in FIG. 5. Likewise, the more complex filter 41, which employs a number of filters similar to filter 11, can also be designed in a conventional manner by using the equivalent circuit of FIG. 5 to represent each of the individual filters being employed. It should be further pointed out, moreover, that the design of such filters could also be realized by employing a more conventional ladder-type equivalent circuit of MCF 11 illustrated in FIG. 9. More specifically, the design of a particular filter might be carried out by first determining the parameter values of the conventional ladder circuit of FIG. 9 which results in the desired response. Thereafter, standard network transformation techniques can be used to transform the ladder circuit into its equivalent shown in FIG. 5 so as to determine the parameter values of such equivalent. The latter parameter values can then be used to determine the physical parameters of the filter.

in all cases, it is understood that the above-described arrangements are merely illustrative of the many possible specific embodiments which represent applications of the present invention. Numerous and varied other arrangements can be readily devised in accordance with the principles of the present invention without departing from the spirit and scope of the invention.

What is claimed is:

1. A monolithic crystal filter apparatus including a piezoelectric wafer and a plurality of coupled crystal resonator elements including electrode pairs partially enclosing portions of the piezoelectric wafer, the electrodes on one side of said wafer being conventionally designated as the common terminal for connection of input and output ports to said resonator elements, characterized in that one of the ports is connected only between electrodes on the other side of said wafer.

2. A monolithic crystal filter apparatus according to claim 1 including a second piezoelectric wafer and a second plurality of coupled crystal resonator elements including electrode pairs partially enclosing portions of the second wafer and having a second input port and a second output port, the output port of the first plurality of resonator elements being connected to the input port of the second plurality of resonator elements, said apparatus being further characterized in that one of the second input and output ports is connected only between electrodes on a particular side of the second wafer.

3. A monolithic crystal filter apparatus according to claim 2 characterized, in addition, by a first plurality of capacitances connected across respective ports connected only between electrodes on a particular side of a wafer, and a second plurality of capacitances respectively connected in series with the signal paths for the other ports of the plurality of resonator elements.

* * * * *